United States Patent
Lee et al.

(10) Patent No.: US 12,235,582 B2
(45) Date of Patent: *Feb. 25, 2025

(54) SEMICONDUCTOR DEVELOPER TOOL AND METHODS OF OPERATION

(71) Applicant: Taiwan Semiconductor Manufacturing Company, Ltd., Hsinchu (TW)

(72) Inventors: Yung-Yao Lee, Zhubei (TW); Chen Yi Hsu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/357,347

(22) Filed: Jul. 24, 2023

(65) Prior Publication Data

US 2023/0367219 A1 Nov. 16, 2023

Related U.S. Application Data

(63) Continuation of application No. 17/303,525, filed on Jun. 1, 2021, now Pat. No. 11,747,729.

(60) Provisional application No. 63/200,650, filed on Mar. 19, 2021.

(51) Int. Cl.
*G03F 7/16* (2006.01)
*H01L 21/027* (2006.01)

(52) U.S. Cl.
CPC .......... *G03F 7/162* (2013.01); *H01L 21/0274* (2013.01)

(58) Field of Classification Search
CPC ............. H01L 21/0274; H01L 21/6708; H01L 21/6715; G03F 7/162; G03F 7/3021
See application file for complete search history.

(56) References Cited

U.S. PATENT DOCUMENTS

| | | |
|---|---|---|
| 6,139,406 A | 10/2000 | Kennedy et al. |
| 6,210,050 B1 | 4/2001 | Plat et al. |
| 6,796,517 B1 | 9/2004 | Pike |
| 7,208,262 B2 | 4/2007 | Gurer et al. |
| 7,387,455 B2 | 6/2008 | Awamura et al. |
| 9,505,019 B2 | 11/2016 | Inatomi et al. |
| 9,941,131 B1 | 4/2018 | Lin et al. |
| 10,203,606 B1 | 2/2019 | Chao et al. |
| 2001/0014536 A1 | 8/2001 | Nakamura et al. |
| 2001/0043813 A1 | 11/2001 | Kitamura |
| 2002/0046703 A1 | 4/2002 | Templeton |
| 2004/0115567 A1 | 6/2004 | Mandal et al. |
| 2008/0163899 A1 | 7/2008 | Takiguchi et al. |
| 2010/0216078 A1 | 8/2010 | Yamamoto et al. |
| 2015/0036109 A1 | 2/2015 | Yoshihara et al. |
| 2017/0045821 A1 | 2/2017 | Yoshihara et al. |

(Continued)

*Primary Examiner* — Deoram Persaud
(74) *Attorney, Agent, or Firm* — Harrity & Harrity, LLP

(57) ABSTRACT

A developer tool described herein includes a dispenser that includes a greater quantity of nozzles in a central portion relative to a perimeter portion such that the developer tool is capable of more effectively removing material from a photoresist layer near a center of a substrate (which tends to be thicker near the center of the substrate relative to the edge or perimeter of the substrate). In this way, the developer tool may reduce the amount of photoresist residue or scum remaining on the substrate near the center of the substrate after a development operation, which may enable defect removal and/or prevention, may increase semiconductor processing yield, and/or may increase semiconductor processing quality.

20 Claims, 12 Drawing Sheets

(56) References Cited

U.S. PATENT DOCUMENTS

| | | |
|---|---|---|
| 2019/0294049 A1 | 9/2019 | Harumoto et al. |
| 2020/0004153 A1 | 1/2020 | Cheng et al. |
| 2020/0133128 A1 | 4/2020 | Kuo et al. |
| 2022/0299876 A1 | 9/2022 | Lee et al. |

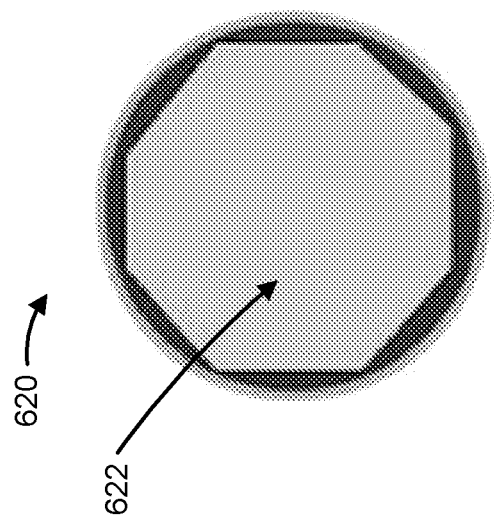
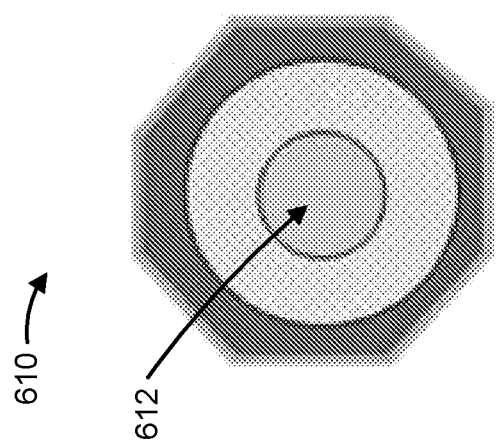
FIG. 6

SEMICONDUCTOR DEVELOPER TOOL AND METHODS OF OPERATION

CROSS-REFERENCE TO RELATED APPLICATIONS

This application is a continuation of U.S. patent application Ser. No. 17/303,525, filed Jun. 1, 2021, which claims priority to U.S. Provisional Patent Application No. 63/200,650, filed on Mar. 19, 2021, the contents of which are incorporated herein by reference in their entireties.

BACKGROUND

A developer tool is a semiconductor processing tool that is capable of developing a photoresist layer that has been exposed to a radiation source to develop a pattern transferred to the photoresist layer from an exposure tool. A developer tool may develop a pattern by removing exposed or unexposed portions of a photoresist layer using a chemical developer agent. The developer tool may dispense the chemical developer agent onto a photoresist layer on a substrate, and the chemical developer agent may dissolve exposed or unexposed portions of the photoresist layer to expose the pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a diagram of example semiconductor structures described herein.

DETAILED DESCRIPTION

Figure 1:
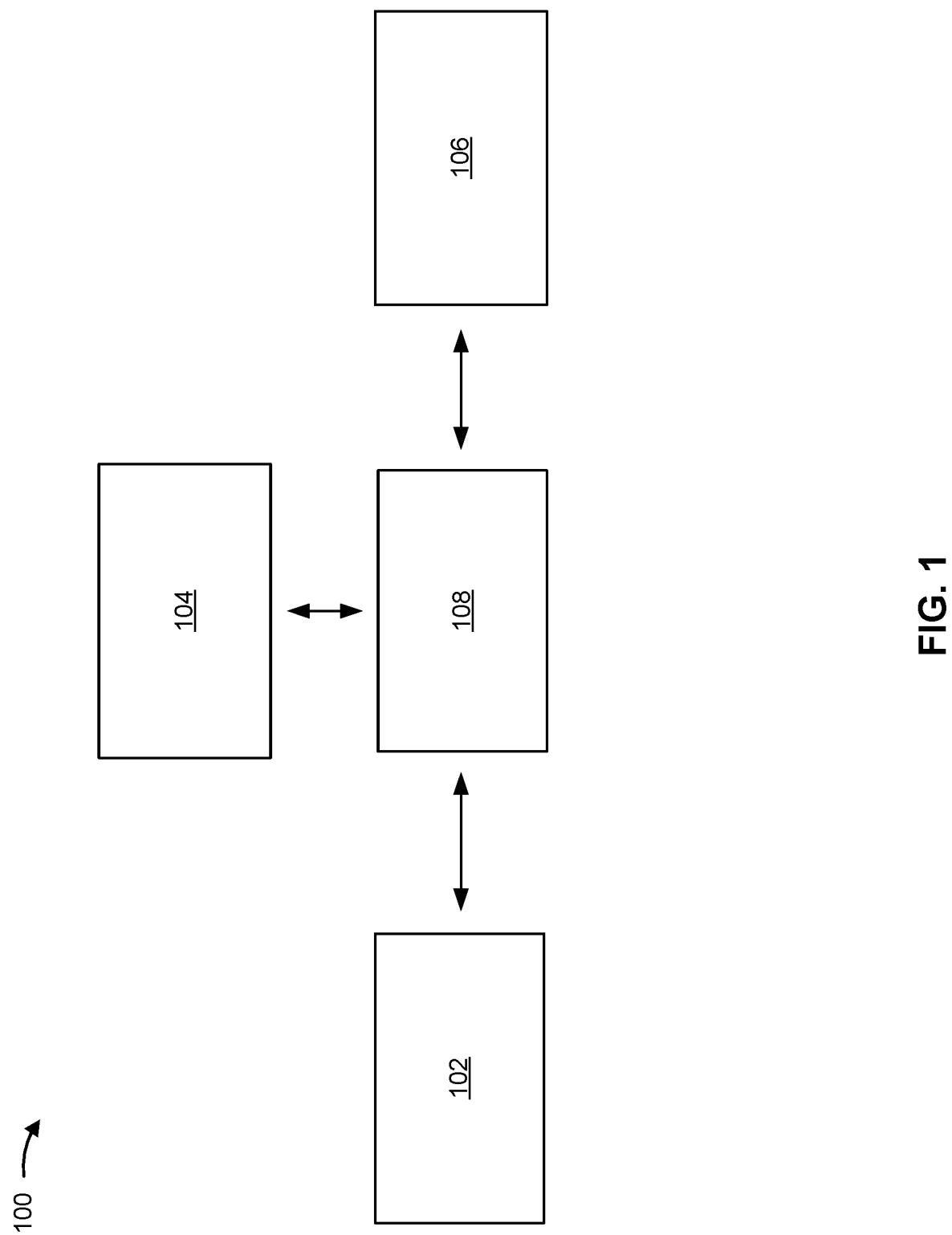
FIG. 1 is a diagram of an example environment described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a high viscosity material (e.g., polyimide ($C_xH_yN_zO_w$) or another high viscosity photoresist material) may be used to form a photoresist layer on a substrate. A high viscosity material may result in an uneven photoresist layer in which a thickness of the photoresist layer is greater near a center of a substrate relative to a thickness of the photoresist layer near an edge or parameter of the substrate. The uneven photoresist layer may result from the difficulty of distributing the high viscosity material across the substrate due to the resistance to flow of the high viscosity material. Moreover, the high viscosity material may leave behind photoresist residue or scum after the development process. The photoresist residue or scum may result from incomplete removal of the photoresist layer in thicker areas of the photoresist layer (e.g., which may result from the uneven distribution of the high viscosity material across the substrate). The photoresist residue or scum may interfere with a subsequent etching operation or ion implantation in which the pattern is used to etch the substrate or implant ions into the substrate.

Some implementations described herein provide a developer tool for use with high viscosity photoresist materials and/or other types of photoresist materials. The developer tool includes a dispenser that includes a greater quantity of nozzles in a central portion relative to a perimeter portion such that the developer tool is capable of more effectively removing material from a photoresist layer near a center of a substrate (which tends to be thicker near the center of the substrate relative to the edge or perimeter of the substrate). In this way, the developer tool may reduce the amount of photoresist residue or scum remaining on the substrate near the center of the substrate after a development operation, which may enable defect removal and/or prevention, may increase semiconductor processing yield, and/or may increase semiconductor processing quality.

FIG. 1 is a diagram of an example environment 100 in which systems and/or methods described herein may be implemented. As shown in FIG. 1, the example environment 100 may include a plurality of semiconductor processing tools 102-106 and a wafer/die transport tool 108. The plurality of semiconductor processing tools 102-106 may include a deposition tool 102, an exposure tool 104, a developer tool 106, and/or another type of semiconductor processing tool. The tools included in the example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

Wafer/die transport tool 108 includes a mobile robot, a robot arm, a tram or rail car, an overhead hoist transport (OHT) system, an automated materially handling system (AMHS), and/or another type of device that is used to transport wafers and/or dies between semiconductor processing tools 102-106 and/or to and from other locations such as a wafer rack, a storage room, and/or the like. In some implementations, wafer/die transport tool 108 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
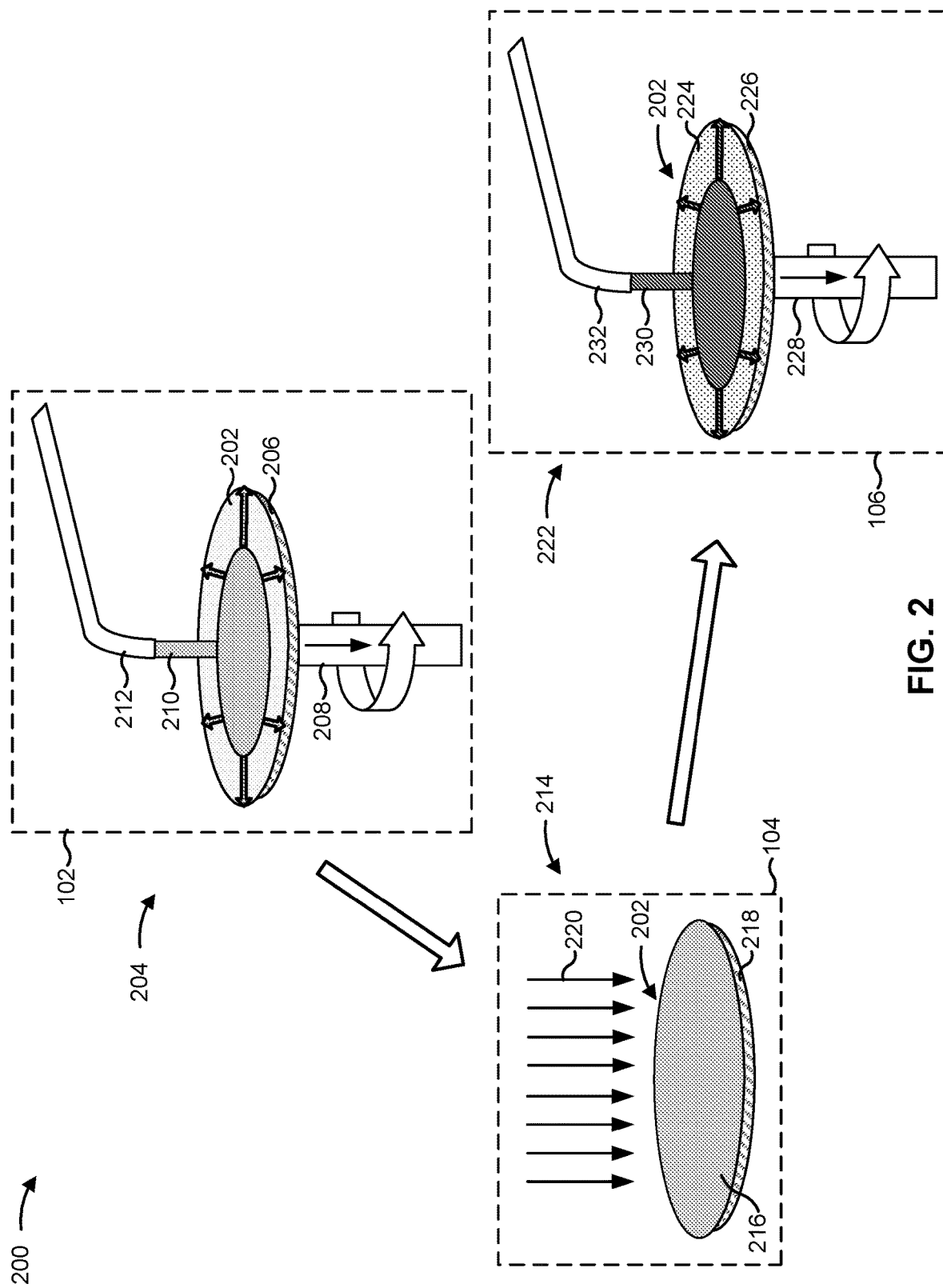
FIG. 2 is a diagram of an example implementation described herein.

FIG. 2 is a diagram of an example implementation 200 described herein. The example implementation 200 may include an example of forming a pattern in a photoresist layer on a substrate 202. In some implementations, the substrate 202 includes a semiconductor wafer, a portion of a component such as a photomask or a reticle for use in a semiconductor processing tool, or a semiconductor device, among other examples. As shown in FIG. 2, the example implementation 200 includes operations performed by one or more of the semiconductor processing tools of the example environment 100 of FIG. 1, such as the deposition tool 102, the exposure tool 104, and the developer tool 106.

As shown in FIG. 2, and by reference number 204, the substrate 202 is processed through a deposition operation in which the substrate 202 is positioned on a chuck 206 (e.g., a vacuum chuck or another type of chuck) of the deposition tool 102. The deposition operation includes a spin-coating operation in which the substrate 202 is secured to the chuck 206 by a vacuum force and is spun or rotated about an axis of a support member 208 of the deposition tool 102. While the substrate 202 is rotated, the deposition tool 102 dispenses a photoresist material 210 onto the substrate 202 through a process arm 212 such that the rotation of the substrate 202 causes the photoresist material 210 to be distributed across the top surface of the substrate 202. The photoresist material 210 is permitted to solidify on the substrate 202 after the deposition operation. In some implementations, the substrate 202 is pre-baked to remove a solvent from the photoresist material 210 to facilitate solidification of the photoresist material 210.

In some implementations, a high viscosity material (e.g., polyimide ($C_xH_yN_zO_w$) or another high viscosity photoresist material) is used as the photoresist material 210. High viscosity photoresist material may permit thicker photoresist layers to be formed and/or may reduce the amount of photoresist material waste in a deposition operation (as less material is spun off of a substrate due to the higher viscosity). In some implementations, a high viscosity photoresist material includes a material having a viscosity of greater than approximately 100 centipoises (cP). In some implementations, a high viscosity photoresist material includes a material having a viscosity of greater than approximately 1000 centipoises (cP). However, the use of other photoresist materials having different viscosities are within the scope of the present disclosure.

As further shown in FIG. 2, and by reference number 214, the substrate 202 is processed through an exposure operation in which a photoresist layer 216 on the substrate 202 is exposed to radiation to form a pattern in the photoresist layer 216. The photoresist layer 216 is formed by the solidified photoresist material 210 on the substrate 202. The substrate 202 is positioned on a wafer stage 218 of the exposure tool 104. In the exposure operation, the photoresist layer 216 is exposed to radiation 220 to form the pattern in the photoresist layer 216. The pattern may be used to etch the substrate 202, to implant ions into the substrate 202, and/or to perform another type of semiconductor processing operation.

As further shown in FIG. 2, and by reference number 222, the substrate 202 is processed through a development operation in which an exposed photoresist layer 224 on the substrate 202 is developed to expose the pattern. The substrate 202 is positioned on a chuck 226 (e.g., a vacuum chuck or another type of chuck) of the developer tool 106. The substrate 202 is secured to the chuck 226 by a vacuum force and is spun or rotated about an axis of a support member 228 of the developer tool 106. While the substrate 202 is rotated, the developer tool 106 dispenses a developer agent 230 onto the substrate 202 through a process arm 232 such that the rotation of the substrate 202 causes the developer agent 230 to be distributed across the exposed photoresist layer 224. The developer agent 230 includes a chemical developer agent such as a cyclopentanone ($C_xH_yO_z$) or another type of chemical developer agent that is capable of stripping or removing exposed portions or unexposed portions of the exposed photoresist layer 224 to expose the pattern in the exposed photoresist layer 224.

As indicated above, FIG. 2 is provided as an example. Other examples may differ from what is described with regard to FIG. 2.

Figure 3A:
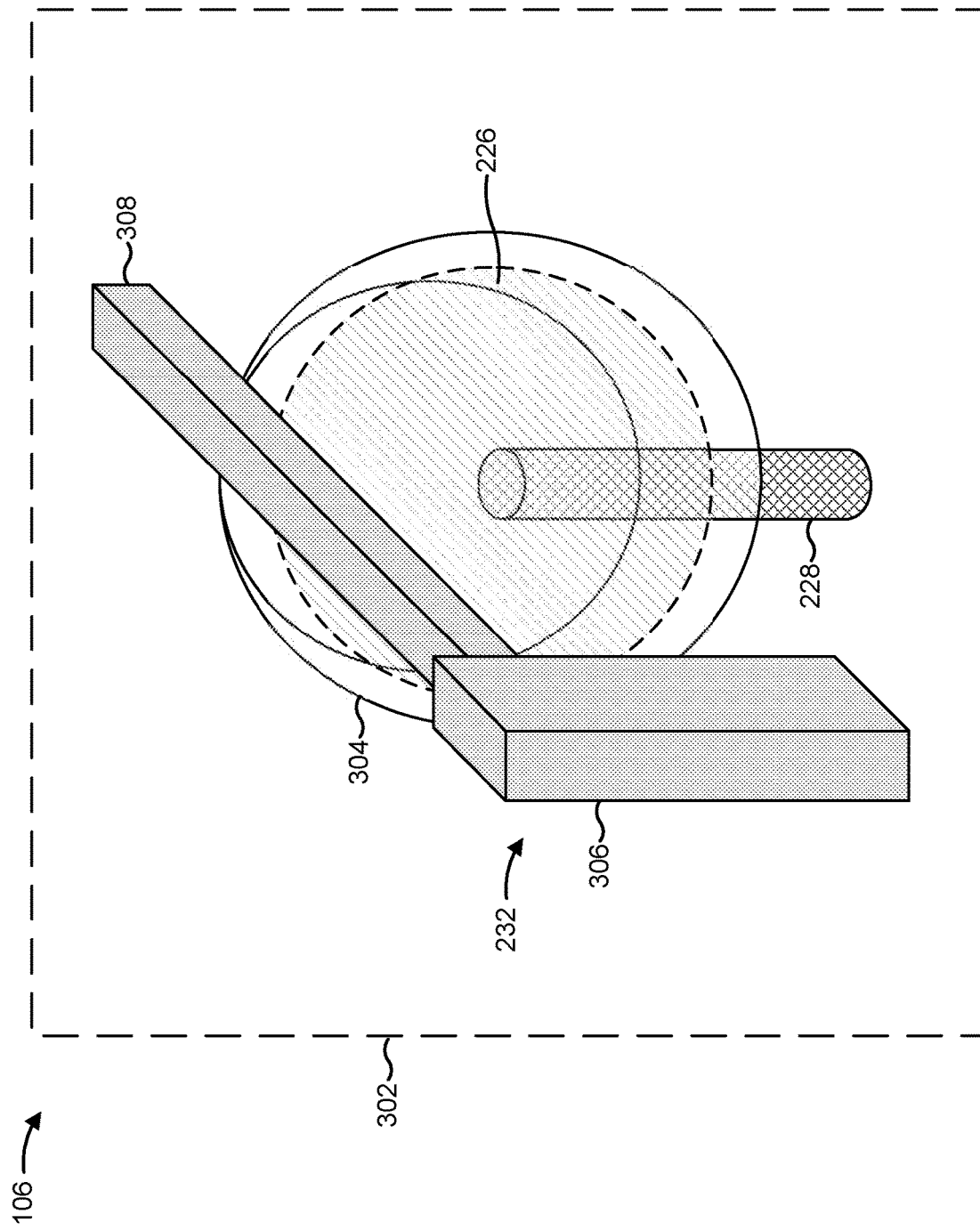
FIGS. 3A and 3B are diagrams of an example developer tool described herein.
Figure 3B:
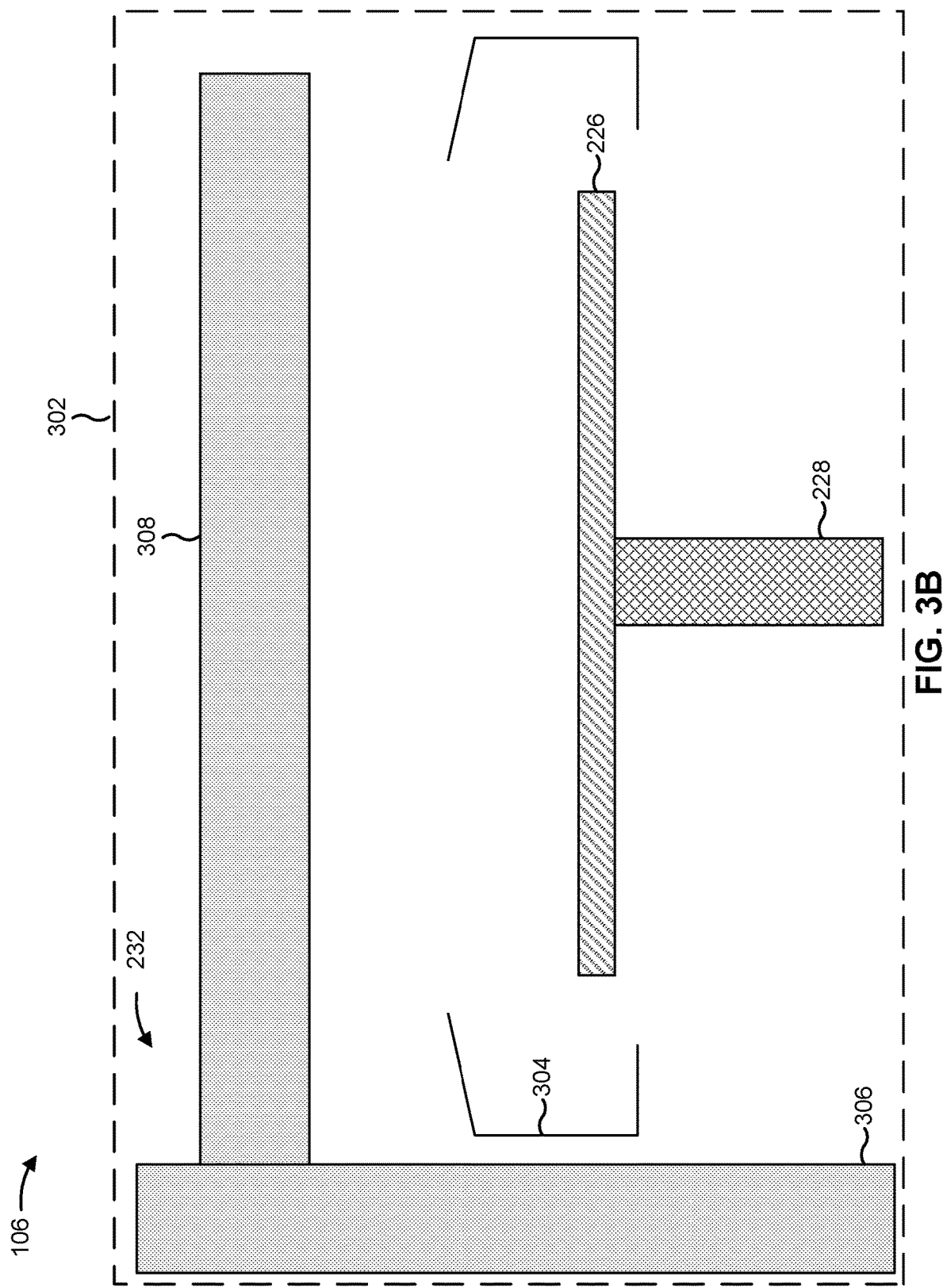

FIGS. 3A and 3B are diagrams of the developer tool 106 described herein. FIG. 3A illustrates a perspective view of the developer tool 106, and FIG. 3B illustrates an elevation view of a cross section of the developer tool 106. As shown in FIGS. 3A and 3B, the developer tool 106 includes the chuck 226, the support member 228, and the process arm 232 in a process chamber 302. The process chamber 302 may be configured to be sealed (e.g., hermetically sealed) such that the environment in the process chamber 302 may be controlled to minimize oxidation and/or other types of defects for substrates that are processed by the developer tool 106. The support member 228 extends downward from the chuck 226. The support member 228 is positioned approximately at the center of the chuck 226 such that the chuck 226 is permitted to spin or rotate evenly and in a smooth manner about an axis along a long dimension of the support member 228.

As further shown in FIGS. 3A and 3B, the developer tool 106 includes a coater unit chamber (CUP) 304 that surrounds the chuck 226. The CUP 304 is configured to catch excess developer agent that is spun off of a substrate by the chuck 226 such that the excess developer agent may be drained or otherwise removed from the process chamber 302.

The process arm 232 includes a support member 306 and a dispenser 308 that is supported by and extends away from the support member 306 over the chuck 226. The dispenser 308 is configured to dispense the developer agent 230 onto a substrate that is positioned on the chuck 226 while the chuck 226 rotates the substrate.

As indicated above, FIGS. 3A and 3B are provided as an example. Other examples may differ from what is described with regard to FIGS. 3A and 3B.

Figure 4A:
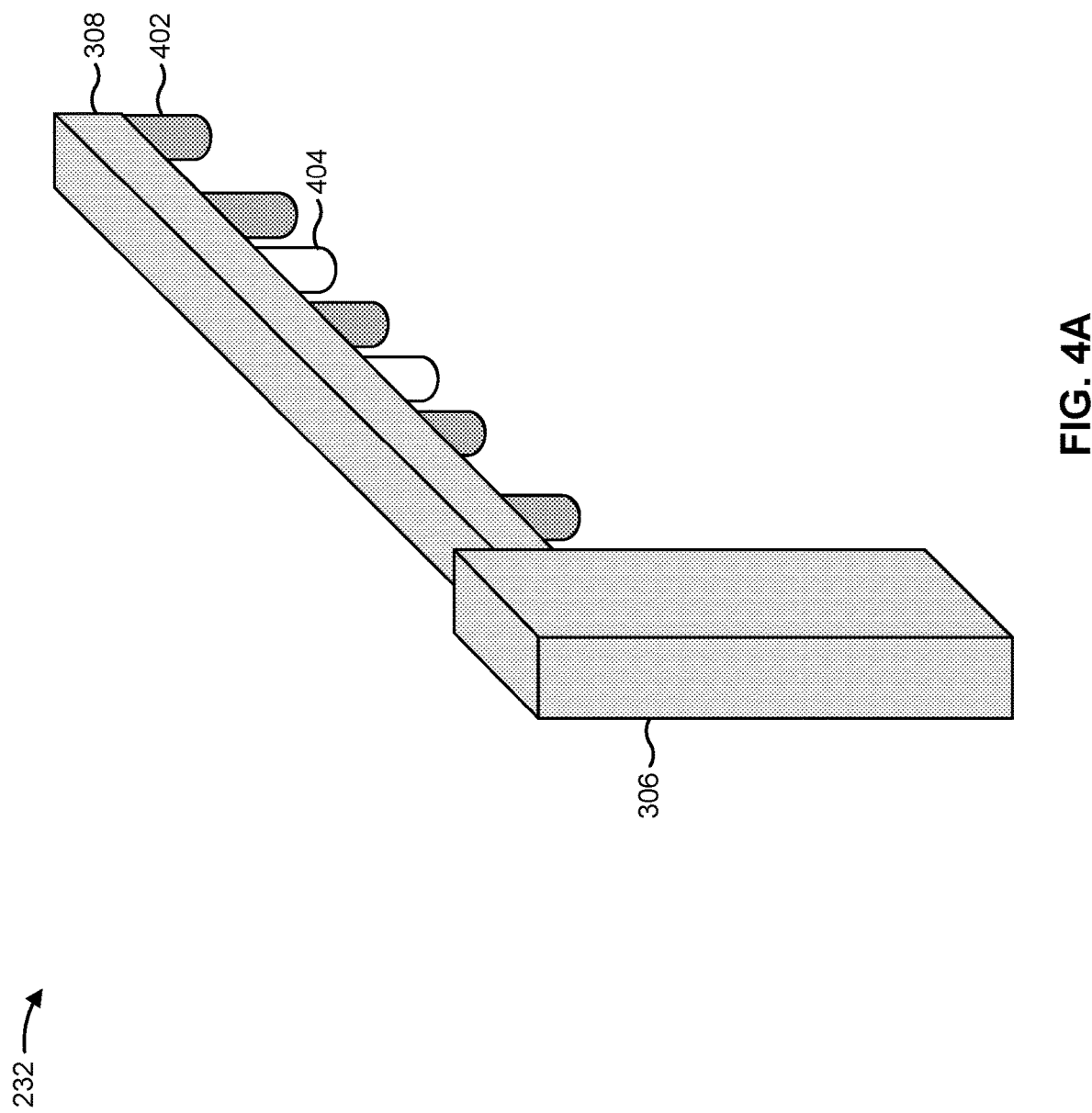
FIGS. 4A-4C are diagrams of an example process arm described herein.
Figure 4B:
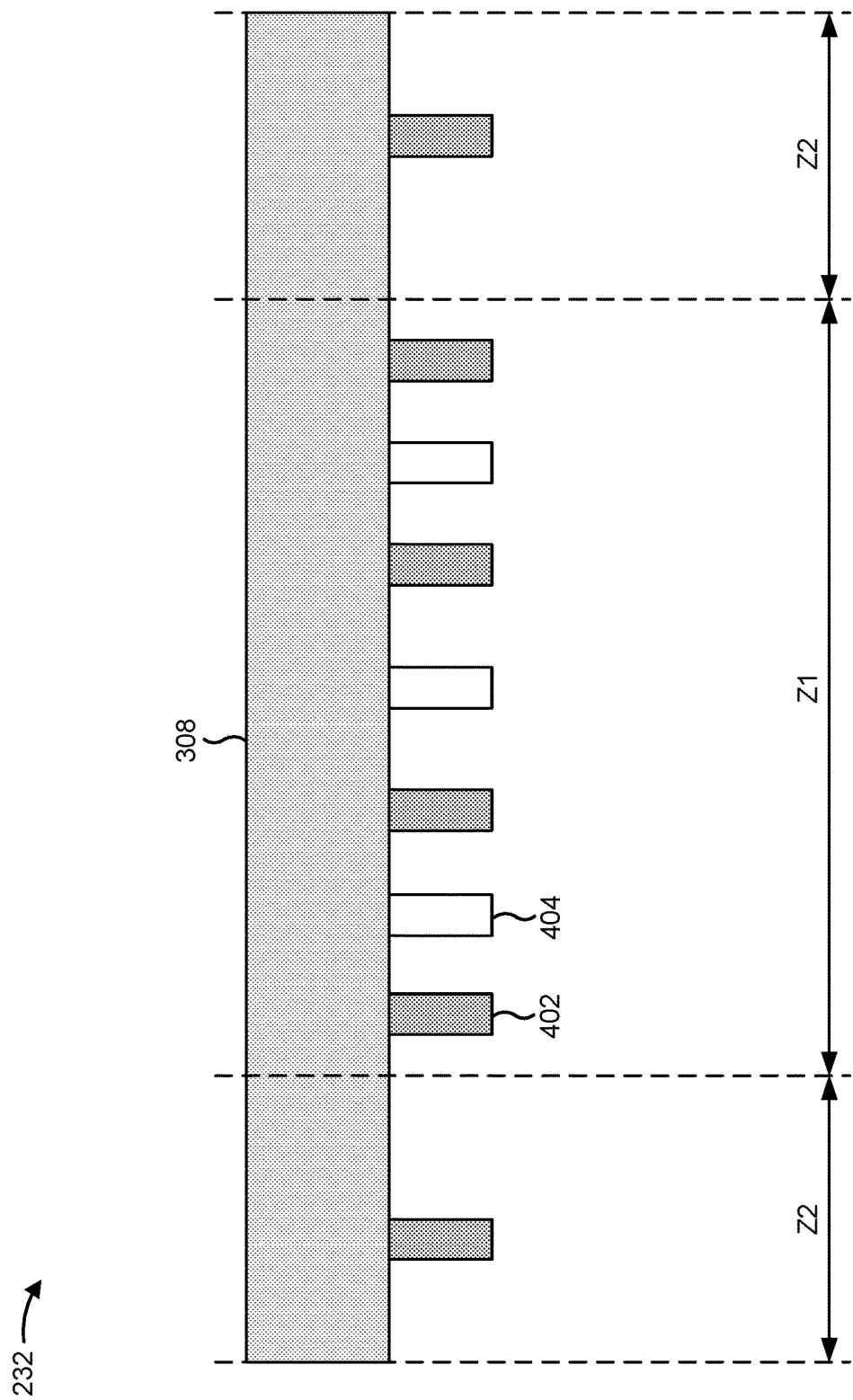
Figure 4C:
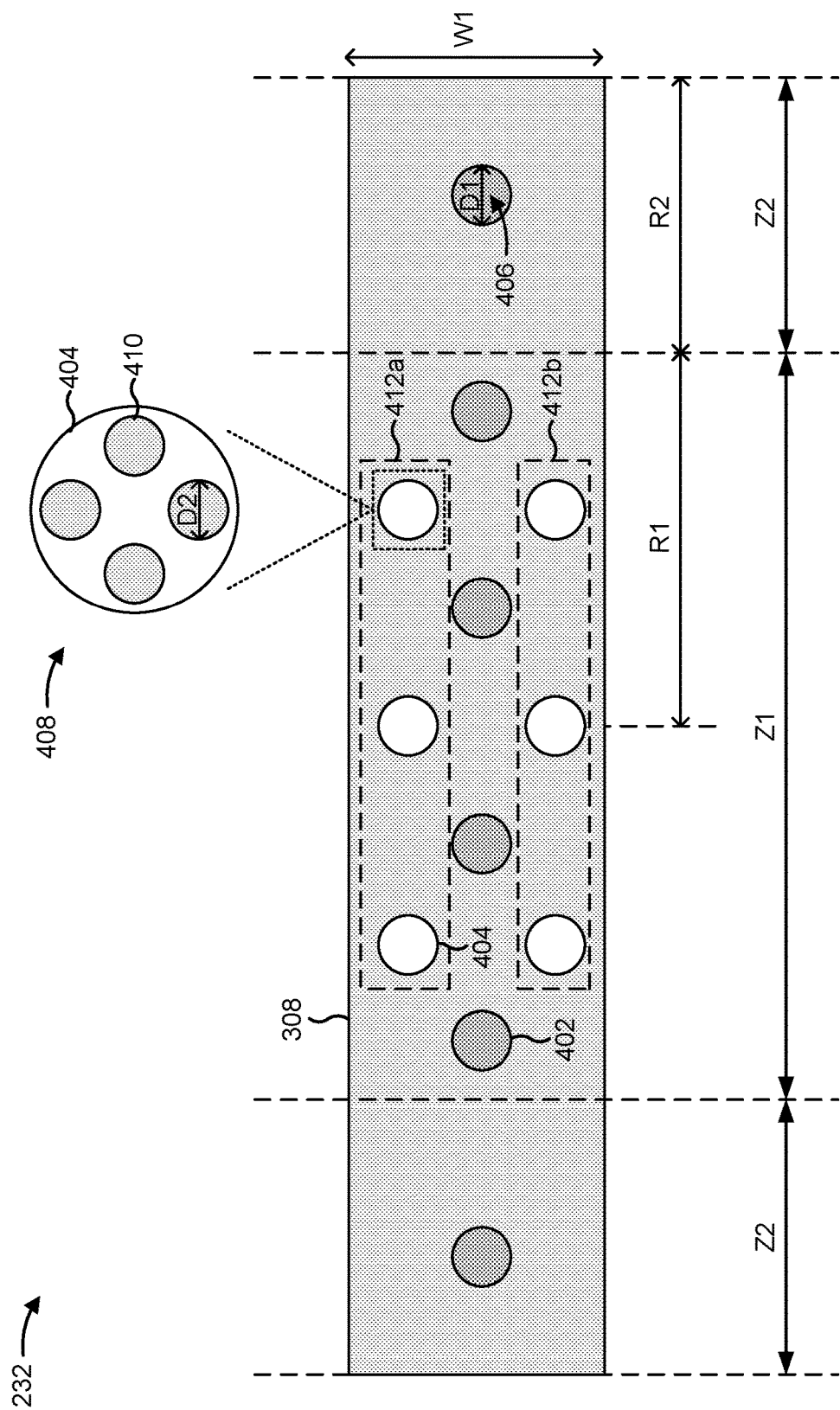

FIGS. 4A-4C are diagrams of the process arm 232 described herein. FIG. 4A illustrates a perspective view of the process arm 232. As shown in FIG. 4A, the dispenser 308 of the process arm 232 includes a plurality of nozzles through which the developer agent 230 is dispensed. The dispenser 308 includes a plurality of different types of nozzles, including a first plurality of nozzles 402 and a second plurality of nozzles 404. The second plurality of nozzles 404 are configured to supplement the first plurality of nozzles 402 in dispensing the developer agent 230 to compensate for the different thicknesses in a photoresist layer (e.g., the exposed photoresist layer 224 on the substrate 202) that may result from the use of a high viscosity photoresist material (e.g., the photoresist material 210).

FIG. 4B illustrates an elevation view of the dispenser 308 of the process arm 232. As shown in FIG. 4B, the nozzles 402 and 404 extend downward from a bottom surface of the dispenser 308. As further shown in FIG. 4B, the dispenser 308 may be divided into a plurality of portions, including a central portion (Z1) and perimeter portions (Z2) adjacent to and on opposing sides of the central portion (Z1). The central portion (Z1) includes a greater quantity of nozzles relative to the quantity of nozzles included in each of the perimeter portions (Z2). In particular, the central portion (Z1) of the dispenser 308 may include the nozzles 404 and a first subset of the nozzles 402, whereas the perimeter portions (Z2) include a second subset of the nozzles 402.

The greater quantity of nozzles in the central portion (Z1) permits the developer tool 106 to dispense a greater amount of the developer agent 230 in the central portion (Z1) relative to the amount of the developer agent 230 dispensed in the perimeter portions (Z2). The greater amount of the developer agent 230 permits the developer tool 106 to remove a greater amount of a photoresist layer (e.g., the exposed photoresist layer 224) on a substrate (e.g., on the substrate 202) relative to the amount of the photoresist layer that is removed in the perimeter portions (Z2) to compensate for the greater thickness of the photoresist layer near the center of the substrate that may result from the use of a high viscosity photoresist material (e.g., the photoresist material 210).

In some implementations, the size (e.g., width) of the central portion (Z1) is based on a size of the substrates that are to be processed by the developer tool 106, a thickness (or an estimated thickness) of the photoresist layers that are to be developed by the developer tool 106, a viscosity of a photoresist material that is to be used to form the photoresist layers that are to be developed by the developer tool 106, a time duration for dispensing the developer agent 230 onto the photoresist layers, and/or another type of parameter. As an example, the width of the central portion (Z1) may be increased for a photoresist layer that has a greater thickness near a central portion of a substrate relative to other photoresist layers, for higher viscosity photoresist materials, and/or for larger substrates (e.g., substrates having a greater width or diameter relative to other substrates). As another example, the width of the central portion (Z1) may be decreased for a photoresist layer that has a lesser thickness near a central portion of a substrate relative to other photoresist layers, for lower viscosity photoresist materials, and/or for smaller substrates (e.g., substrates having a lesser width or diameter relative to other substrates).

In some implementations, the width of the central portion (Z1) is in a range of greater than 0 millimeters to approximately 270 millimeters such that a greater amount of the developer agent 230 is dispensed near a corresponding central portion of a substrate to compensate for thicker photoresist layers near the central portion of the substrate. In some implementations, the width of the perimeter portions (Z2) is based on the width of the central portion (Z1) and the size of the substrates that are to be processed by the developer tool 106 so that the developer agent 230 is dispensed to fully cover the substrates (e.g., to minimize and/or prevent gaps in the coverage of the developer agent 230 on the substrates). As an example, the width of each of the perimeter portions (Z2) is in a range of greater than 0 millimeters to approximately 15 millimeters such that the developer agent 230 fully covers the substrates that are to be processed by the developer tool 106. However, other values for the width of the central portion (Z1) and the widths for the perimeter portions (Z2) are within the scope of the present disclosure.

FIG. 4C illustrates a bottom-up view of the dispenser 308 of the process arm 232. As indicated above, in some implementations, the nozzles 402 and the nozzles 404 include different types of nozzles for dispensing the developer agent 230. Each of the nozzles 402 may include a single opening 406 through which the developer agent 230 is dispensed. An opening 406 may have a diameter (D1) that is in a range of approximately 2 millimeters to approximately 50 millimeters to dispense a sufficient amount of developer agent 230 in the perimeter portions (Z2) and to minimize over-development in the perimeter portions (Z2). However, other values for the diameter (D1) of an opening 406 are within the scope of the present disclosure.

As shown in a detailed view 408 in FIG. 4C, each of the nozzles 404 (or a subset thereof) include a plurality of openings 410. Including a plurality of openings 410 in a nozzle 404 enables the nozzle 404 to more-precisely dispense the developer agent 230 relative to the nozzles 402. An opening 410 may have a diameter (D2) that is less than the diameter (D1) of an opening 406 to permit a plurality of openings 410 to be included in a nozzle 404. In some implementations, the diameter (D2) is in a range of greater than 0 millimeters to less than approximately 50 millimeters to dispense a sufficient amount of developer agent 230 in the central portion (Z1) along with the nozzles 402 and to minimize over-development in the central portion (Z1). However, other values for the diameter (D2) of an opening 410 are within the scope of the present disclosure.

In some implementations, the quantity of the nozzles 404 included the central portion (Z1), and in some cases, the nozzle density of the central portion (Z1), is based on various parameters. In some implementations, the parameters include a size of the substrates that are to be processed by the developer tool 106, a thickness (or an estimated thickness) of the photoresist layers that are to be developed by the developer tool 106, a viscosity of a photoresist material that is to be used to form the photoresist layers that are to be developed by the developer tool 106, a time duration for dispensing the developer agent 230 onto the photoresist layers, a quantity of the nozzles 402 included in the central portion (Z1), and/or another type of parameter. As an example, the quantity of the nozzles 404 included in the central portion (Z1) may be increased for a photoresist layer that has a greater thickness near a central portion of a substrate relative to other photoresist layers, for higher viscosity photoresist materials, for a lesser quantity of the nozzles 402 included in the central portion (Z1), and/or for larger substrates (e.g., substrates having a greater width or diameter relative to other substrates). As another example, the quantity of the nozzles 404 included in the central portion (Z1) may be decreased for a photoresist layer that has a lesser thickness near a central portion of a substrate relative to other photoresist layers, for lower viscosity photoresist materials, for a greater quantity of the nozzles 402 included in the central portion (Z1), and/or for smaller substrates (e.g., substrates having a lesser width or diameter relative to other substrates). In some implementations, the quantity of the nozzles 404 included in the central portion (Z1) is in a range of 2 to 1000 to dispense a sufficient amount of developer agent 230 in the central portion (Z1) along with the nozzles 402 and to minimize over-development in the central portion (Z1). However, other quantities are within the scope of the present disclosure.

In some implementations, the pin density of the central portion (Z1) is determined such that:

$$(L*A+M*B)/(R1*W) \geq (N*A)/(R2*W)$$

where A corresponds to the quantity of the nozzles 402 to be included in the central portion (Z1), B corresponds to the quantity of the nozzles 404 to be included in the central portion (Z1), R1 corresponds to half of the width of the central portion (Z1), R2 corresponds to a width of a perimeter portion (Z2), W corresponds to a width of the dispenser 308 along a short dimension of the dispenser 308, and L, M, and N are integration parameters.

The nozzles 404 included in the central portion (Z1) may be arranged in various configurations to achieve sufficient coverage by the developer agent 230 and to achieve a particular amount of developer agent 230 dispensed in the central portion (Z1). In some implementations, the nozzles 404 included in the central portion are arranged in a single row in the central portion (Z1). In some implementations, the nozzles 404 included in the central portion are arranged in a plurality of rows in the central portion (Z1), as illustrated in the example in FIG. 4C. In these implementations, a first subset of the nozzles 404 may be included in a first row 412a in the central portion (Z1) and a second subset of the nozzles 404 may be included in a second row 412b in the central portion (Z1). Additional rows of nozzles 404 may be included in the central portion (Z1). In some implementations, the arrangement of the nozzles 404 in the central portion (Z1) is based on the quantity of the nozzles 404 included in the central portion (Z1), the width of the central portion (Z1), the size of the nozzles 404, and/or another type of parameter.

As indicated above, FIGS. 4A-4C are provided as an example. Other examples may differ from what is described with regard to FIGS. 4A-4C.

Figure 5:
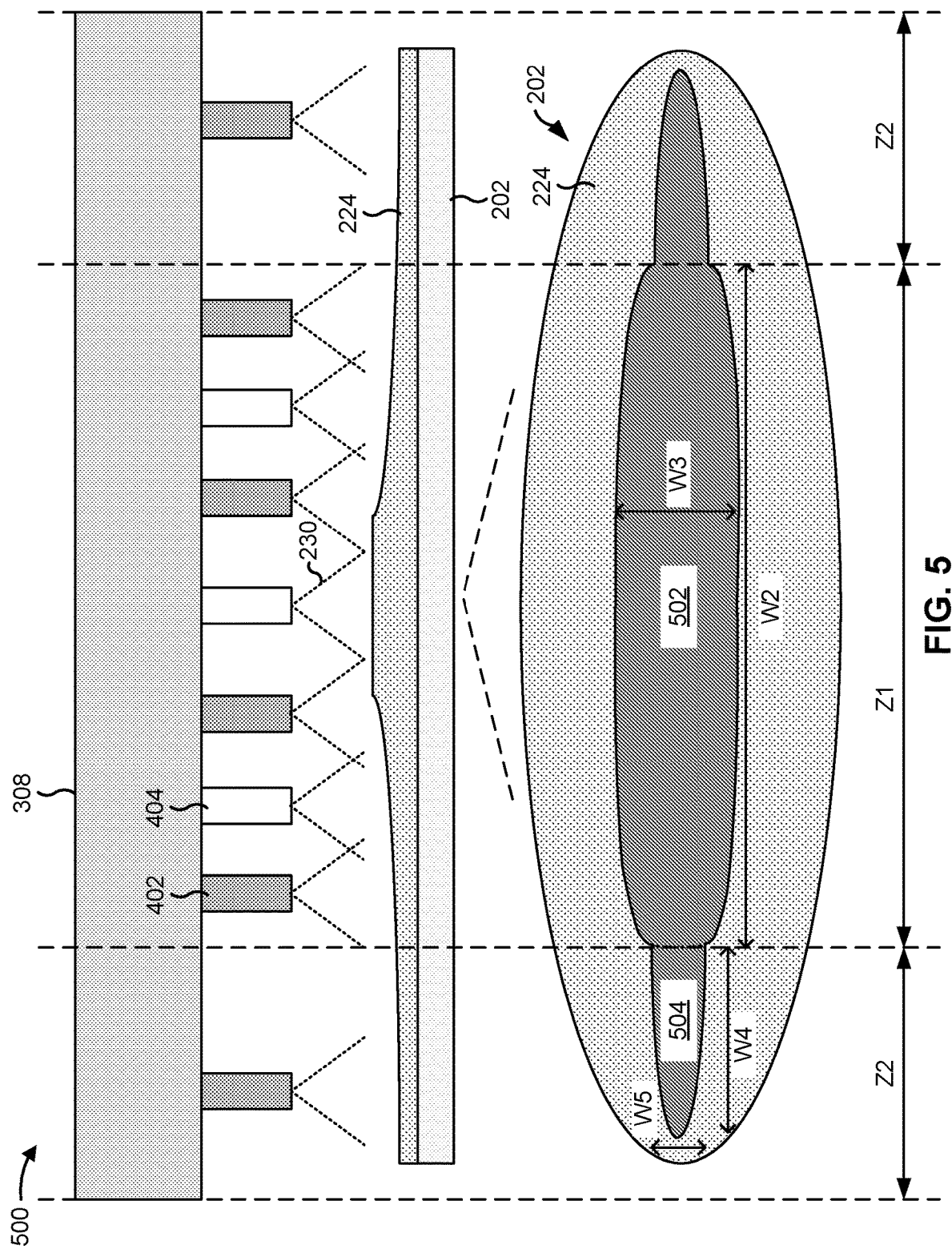
FIG. 5 is a diagram of an example implementation described herein.

FIG. 5 is a diagram of an example implementation 500 described herein. The example implementation 500 is an example of a development operation in which the developer agent 230 is dispensed onto the exposed photoresist layer 224 over the substrate 202 using the dispenser 308 including the nozzles 402 and 404. As shown in FIG. 5, the thickness of the exposed photoresist layer 224 may be different in different areas across the substrate 202. In particular, the thickness of the exposed photoresist layer 224 is greater in the central portion (Z1) of the substrate 202 relative to the thickness of the exposed photoresist layer 224 in the perimeter portion (Z2) of the photoresist layer 224. This may occur, for example, in implementations where the exposed photoresist layer 224 is formed using a high viscosity photoresist material.

As shown in FIG. 5, the developer agent 230 is dispensed through a first subset of the nozzles 402 and through the nozzles 404 in the central portion (Z1) of the dispenser 308 and in the corresponding central portion (Z1) of the substrate 202. The developer agent 230 is dispensed through a second subset of the nozzles 402 in the perimeter portion (Z2) of the dispenser 308 and in the corresponding perimeter portion (Z2) of the substrate 202. In this way, a greater amount or volume of the developer agent 230 is dispensed onto the central portion (Z1) through a greater quantity of nozzles of the dispenser 308 relative to the amount or volume of the developer agent 230 that is dispensed onto the perimeter portion (Z2) through the nozzles of the dispenser 308. This enables the developer tool 106 to more effectively develop a pattern in the exposed photoresist layer 224 in the thicker portion of the exposed photoresist layer 224 in the central portion (Z1) of the substrate 202, which reduces, minimizes, and/or prevents photoresist residue from remaining on the substrate 202 after the development operation.

In some implementations, two or more of the nozzles 404 are configured to dispense the developer agent 230 onto the exposed photoresist layer 224 at different dispensing angles to increase the coverage of the developer agent 230 and to provide substantially even coverage of the exposed photoresist layer 224. In some implementations, at least one of the nozzles 404 is configured to dispense the developer agent 230 onto the exposed photoresist layer 224 at different dispensing angles through a plurality of the openings 410 of the nozzle 404 to increase the coverage of the developer agent 230 and to provide substantially even coverage of the exposed photoresist layer 224. In some implementations, the developer agent 230 is dispensed through openings 410 of a nozzle 404 at an angle that is in a range of approximately 0 degrees relative to an axis along a long dimension of the nozzle 404 to less than approximately 90 degrees relative to the axis along the long dimension of the nozzle 404 to provide substantially even coverage of the exposed photoresist layer 224. However, other dispensing angles are within the scope of the present disclosure.

FIG. 5 further illustrates dispensing patterns of the developer agent 230 in the central portion (Z1) of the substrate 202 and in the perimeter portion (Z2) of the substrate 202. As shown in FIG. 5, the developer agent 230 is dispensed in an area 502 in the central portion (Z1) of the substrate 202 through the first subset of the nozzles 402 and through the nozzles 404. As further shown in FIG. 5, the developer agent 230 is dispensed in an area 504 in the perimeter portion (Z2) of the substrate 202 through the second subset of the nozzles 402. The area 502 may be greater in size relative to the area 504 such that a greater amount of the developer agent 230 is dispensed onto the exposed photoresist layer 224 in the central portion (Z1) relative to the perimeter portion (Z2) to more effectively develop a pattern in the exposed photoresist layer 224 in the thicker portion of the exposed photoresist layer 224 in the central portion (Z1) of the substrate 202.

In some implementations, a width of the area 502 is in a range of greater than 0 millimeters to approximately 270 millimeters to fully cover the thicker portions of the exposed photoresist layer 224. However, other values for the width of the area 502 are within the scope of the present disclosure. In some implementations, the area 502 is approximately circular such that a width (W2) and a width (W3) are approximately equal. In these implementations, the width of the area 502 corresponds to the diameter of the area 502. In some implementations, the area 502 is symmetrical along one or more axes such that the width (W2) and the width (W3) are different. In some implementations, a width of the area 504 is in a range of greater than 0 millimeters to approximately 15 millimeters to fully cover the remaining portion of the exposed photoresist layer 224 in the perimeter portion (Z2) of the substrate 202 (e.g., the portion of the photoresist layer 224 not covered by the area 502). However, other values for the width of the area 504 are within the scope of the present disclosure. In some implementations, the area 504 is approximately circular such that a width (W4) and a width (W5) are approximately equal. In these implementations, the width of the area 504 corresponds to the diameter of the area 504. In some implementations, the area 504 is symmetrical along one or more axes such that the width (W4) and the width (W5) are different.

The example implementation 500 illustrated in FIG. 5 is a snapshot in time in the development operation to illustrate the areas 502 and 504 of the dispensing pattern of the developer agent 230. In practice, the substrate 202 is rotated such that the developer agent 230 dispensed onto the substrate 202 is distributed to fully coat the exposed photoresist layer 224.

As indicated above, FIG. 5 is provided as an example. Other examples may differ from what is described with regard to FIG. 5.

FIG. 6 is a diagram of example semiconductor structures 610 and 620 described herein. The example semiconductor structures 610 and 620 may include interconnects in a semiconductor device. The interconnects may include vias or another type of interconnect. The example semiconductor structures 610 and 620 were formed using a photoresist layer that includes a high viscosity photoresist material. The example semiconductor structures 610 and 620 were formed in a central portion of a substrate in which photoresist residue resulting from the use of high viscosity photoresist material causes decreased etching performance in the central portion of the substrate.

As shown in FIG. 6, an opening 612 of the example semiconductor structure 610 is smaller relative to an opening 622 of the example semiconductor structure 620 due to the presence of photoresist residue during etching (by an etch tool) of the opening 612. The opening 622 was etched based on a pattern in the photoresist layer that was developed by the developer tool 106 described herein. The developer tool 106 includes the nozzles 402 and 404 in the central portion of the dispenser 308, which increases the effectiveness of removing photoresist material from the photoresist layer in the central portion of the substrate. Accordingly, the etch tool is enabled to more effectively etch the opening 622, which results in the larger opening 622 relative to the opening 612.

As indicated above, FIG. 6 is provided as an example. Other examples may differ from what is described with regard to FIG. 6.

Figure 7:
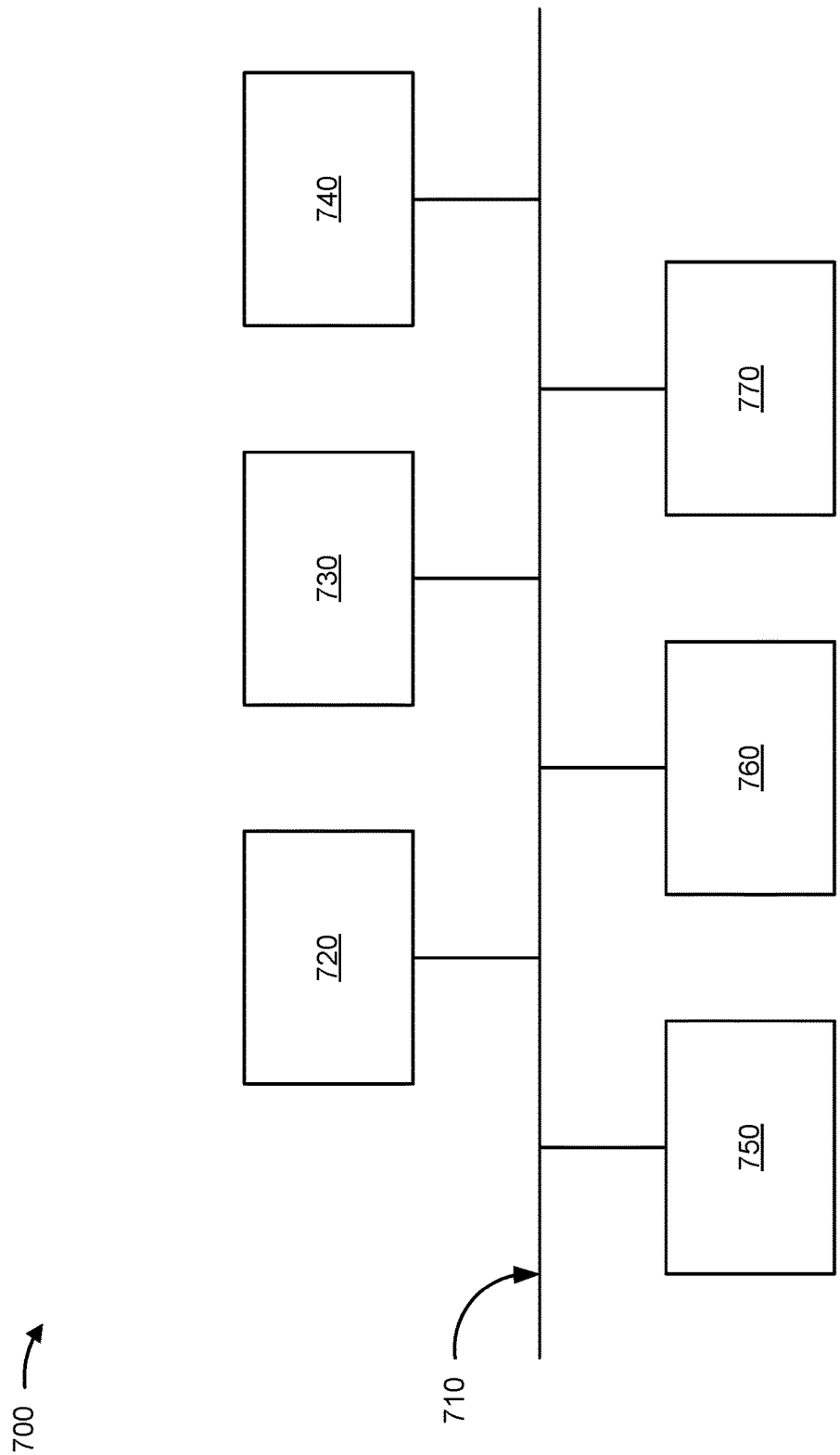
FIG. 7 is a diagram of example components of one or more devices of FIG. 1.

FIG. 7 is a diagram of example components of a device 700. In some implementations, the deposition tool 102, the exposure tool 104, the developer tool 106, and/or the wafer/die transport tool 108 may include one or more devices 700 and/or one or more components of device 700. As shown in FIG. 7, device 700 may include a bus 710, a processor 720, a memory 730, a storage component 740, an input component 750, an output component 760, and a communication component 770.

Bus 710 includes a component that enables wired and/or wireless communication among the components of device 700. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform a function. Memory 730 includes a random access memory, a read only memory, and/or another type of memory (e.g., a flash memory, a magnetic memory, and/or an optical memory).

Storage component 740 stores information and/or software related to the operation of device 700. For example, storage component 740 may include a hard disk drive, a magnetic disk drive, an optical disk drive, a solid state disk drive, a compact disc, a digital versatile disc, and/or another type of non-transitory computer-readable medium. Input component 750 enables device 700 to receive input, such as user input and/or sensed inputs. For example, input component 750 may include a touch screen, a keyboard, a keypad, a mouse, a button, a microphone, a switch, a sensor, a global positioning system component, an accelerometer, a gyroscope, and/or an actuator. Output component 760 enables device 700 to provide output, such as via a display, a speaker, and/or one or more light-emitting diodes. Communication component 770 enables device 700 to communicate with other devices, such as via a wired connection and/or a wireless connection. For example, communication component 770 may include a receiver, a transmitter, a transceiver, a modem, a network interface card, and/or an antenna.

Device 700 may perform one or more processes described herein. For example, a non-transitory computer-readable medium (e.g., memory 730 and/or storage component 740) may store a set of instructions (e.g., one or more instructions, code, software code, and/or program code) for execution by processor 720. Processor 720 may execute the set of instructions to perform one or more processes described herein. In some implementations, execution of the set of instructions, by one or more processors 720, causes the one or more processors 720 and/or the device 700 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
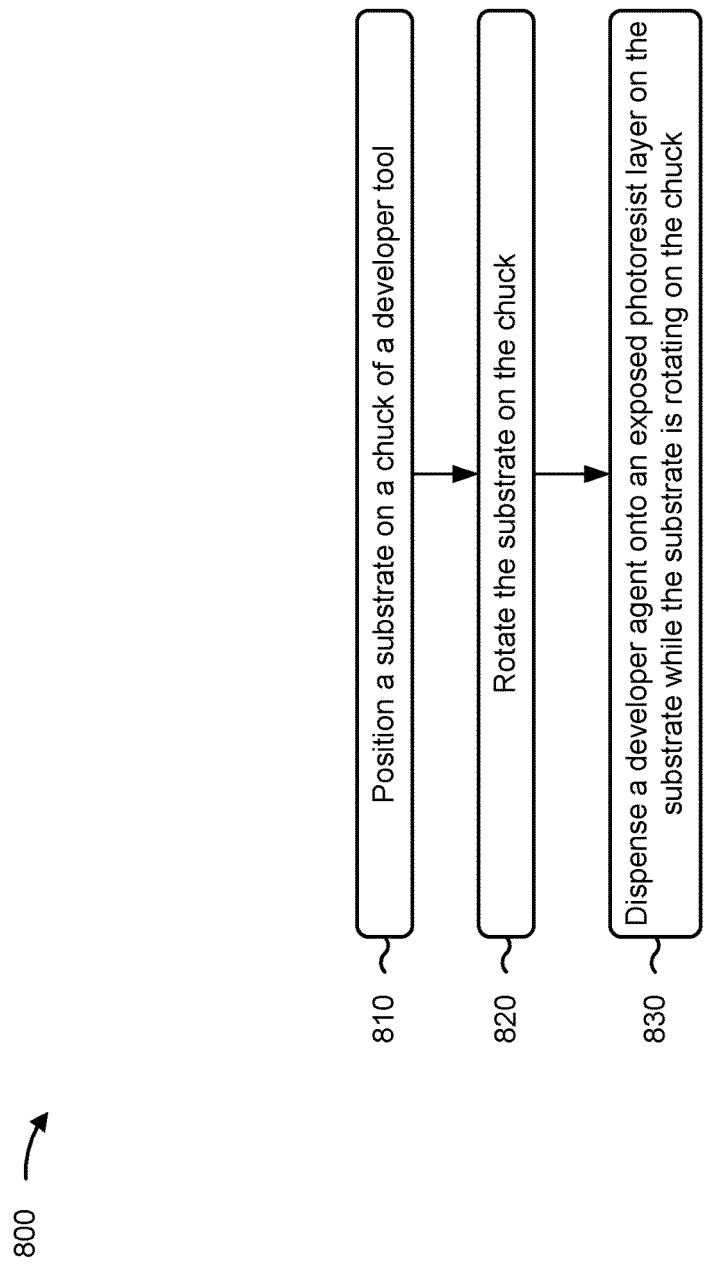
FIGS. 8 and 9 are flowcharts of example processes relating to performing a development operation.

FIG. 8 is a flowchart of an example process 800 associated with developing a photoresist layer on a substrate. In some implementations, one or more process blocks of FIG. 8 may be performed by a developer tool (e.g., the developer tool 106). Additionally, or alternatively, one or more process blocks of FIG. 8 may be performed by one or more components of device 700, such as processor 720, memory 730, storage component 740, input component 750, output component 760, and/or communication component 770.

As shown in FIG. 8, process 800 may include positioning a substrate on a chuck of a developer tool (block 810). For example, the substrate 202 may be positioned on the chuck 226 of the developer tool 106, as described above. In some implementations, the substrate 202 is be positioned on the chuck 226 by the wafer/die transport tool 108 or another tool.

As further shown in FIG. 8, process 800 may include rotating the substrate on the chuck (block 820). For example, the developer tool 106 may rotate the substrate 202 on the chuck 226, as described above.

As further shown in FIG. 8, process 800 may include dispensing a developer agent onto an exposed photoresist layer on the substrate while the substrate is rotating on the chuck (block 830). For example, the developer tool 106 may dispense the developer agent 230 onto the exposed photoresist layer 224 on the substrate 202 while the substrate 202 is rotating on the chuck 226, as described above. In some implementations, the developer agent 230 is dispensed through the plurality of nozzles 404 of the developer tool 106 onto the central portion (Z1) of the substrate 202. In some implementations, the developer agent 230 is dispensed through a respective plurality of openings 410 in each of the plurality of nozzles 404.

Process 800 may include additional implementations, such as any single implementation or any combination of implementations described below and/or in connection with one or more other processes described elsewhere herein.

In a first implementation, the developer agent 230 is dispensed at a plurality of different dispensing angles through a plurality of openings 410 in a nozzle of the plurality of nozzles 404. In a second implementation, alone or in combination with the first implementation, a width of the central portion (Z1) is based on a viscosity of the photoresist material 210 that was used to form the exposed photoresist layer 224. In a third implementation, alone or in combination with one or more of the first and second implementations, a thickness of the exposed photoresist layer 224 in the central portion (Z1) of the substrate 202 is greater relative to a thickness of the photoresist layer in a perimeter portion (Z2) of the substrate 202.

In a fourth implementation, alone or in combination with one or more of the first through third implementations, a quantity of the plurality of nozzles 404 is based on at least one of a size of the substrate 202, a thickness of the exposed photoresist layer 224 in the central portion (Z1) of the substrate 202, a viscosity of the photoresist material 210 that was used for the exposed photoresist layer 224, or a time duration for dispensing the developer agent 230 onto the exposed photoresist layer 224 on the substrate 202. In a fifth implementation, alone or in combination with one or more of the first through fourth implementations, the plurality of nozzles 404 are included in a corresponding central portion (Z1) of the dispenser 308 of the developer tool 106. In a sixth implementation, alone or in combination with one or more of the first through fifth implementations, the developer agent 230 is dispensed through the plurality of nozzles 404 onto the central portion (Z1) of the substrate 202 in an area having a width (W2, W3) in a range of greater than 0 millimeters to approximately 135 millimeters.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Figure 9:
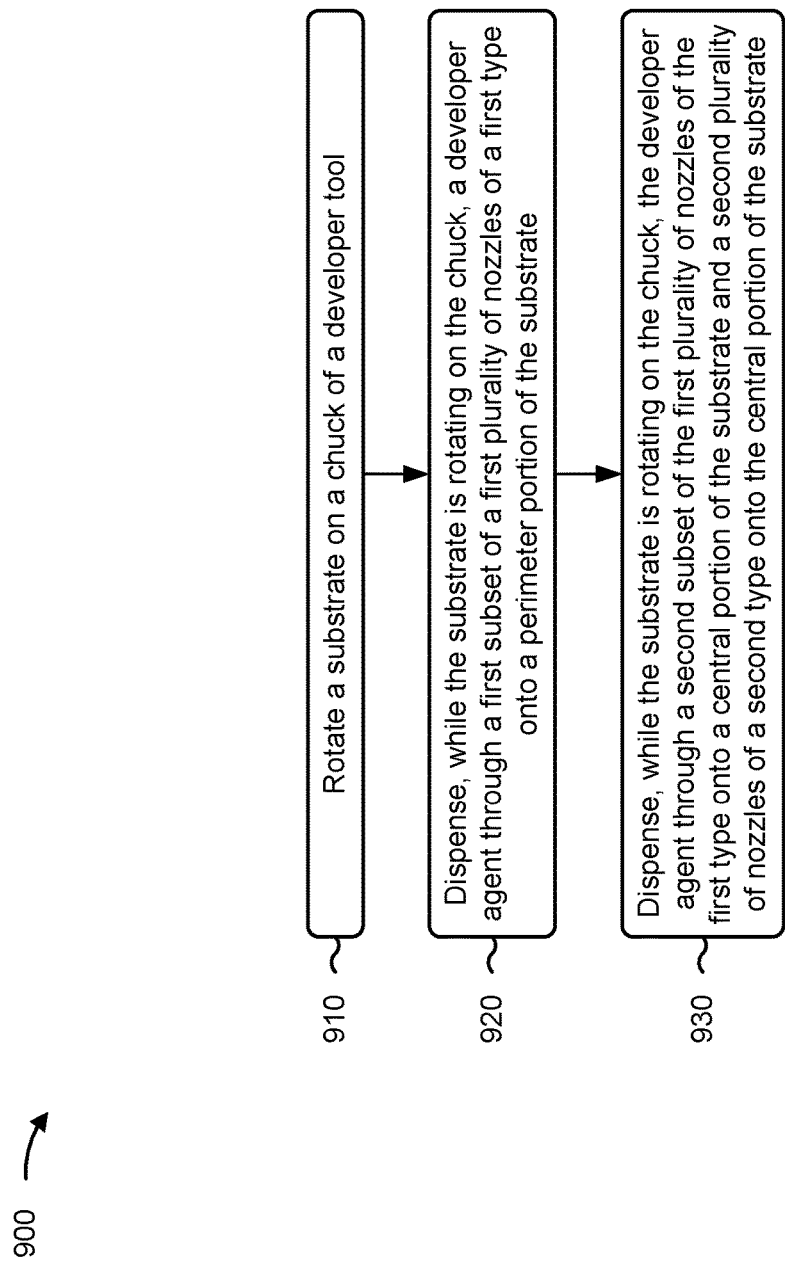

FIG. 9 is a flowchart of an example process 900 associated with developing a photoresist layer on a substrate. In some implementations, one or more process blocks of FIG. 9 may be performed by a developer tool (e.g., the developer tool 106). Additionally, or alternatively, one or more process blocks of FIG. 9 may be performed by one or more components of device 700, such as processor 720, memory 730, storage component 740, input component 750, output component 760, and/or communication component 770.

As shown in FIG. 9, process 900 may include rotating a substrate on a chuck of a developer tool (block 910). For example, the developer tool 106 may rotate the substrate 202 on the chuck 226 of the developer tool 106, as described above.

As further shown in FIG. 9, process 900 may include dispensing, while the substrate is rotating on the chuck, a developer agent through a first subset of a first plurality of nozzles of a first type onto a perimeter portion of the substrate (block 920). For example, the developer tool 106 may dispense, while the substrate 202 is rotating on the chuck 226, the developer agent 230 through a first subset of a first plurality of nozzles 402 of a first type onto a perimeter portion (Z2) of the substrate 202, as described above.

As further shown in FIG. 9, process 900 may include dispensing, while the substrate is rotating on the chuck, the developer agent through a second subset of the first plurality of nozzles of the first type onto a central portion of the substrate and a second plurality of nozzles of a second type onto the central portion of the substrate (block 930). For example, the developer tool 106 may dispense, while the substrate 202 is rotating on the chuck 226, the developer agent 230 through a second subset of the first plurality of nozzles 402 of the first type onto the central portion (Z1) of the substrate 202 and a second plurality of nozzles 404 of a second type onto the central portion (Z1) of the substrate 202, as described above.

Process 900 may include additional implementations, such as any single implementation or any combination of implementations described below and/or in connection with one or more other processes described elsewhere herein.

In a first implementation, dispensing the developer agent 230 through the first subset of the first plurality of nozzles 402 of the first type onto the perimeter portion (Z2) of the substrate 202 includes dispensing the developer agent 230 through the first subset of the first plurality of nozzles 404 of the first type onto the first area 504 of the perimeter portion (Z2) of the substrate 202, and dispensing the developer agent 230 through the second subset of the first plurality of nozzles 402 of the first type and through the second plurality of nozzles 404 of the second type onto the central portion (Z1) of the substrate 202 includes dispensing the developer agent 230 through the second subset of the first plurality of nozzles 402 of the first type and through the second plurality of nozzles 404 of the second type onto the second area 502 of the central portion (Z1) of the substrate 202, and where the second area 502 is greater relative to the first area 504.

In a second implementation, alone or in combination with the first implementation, a width (W2, W3) of the second area 502 is in a range of greater than 0 millimeters to approximately 135 millimeters, and a width (W4, W5) of the first area 504 is in a range of greater than 0 millimeters to approximately 15 millimeters. In a third implementation, alone or in combination with one or more of the first and second implementations, a first diameter (D1) of an opening 406 in a nozzle of the first plurality of nozzles 402 of the first type is in a range of approximately 2 millimeters to approximately 50 millimeters, and a second diameter (D2) of an opening 410 in a nozzle of the second plurality of nozzles 404 of the second type is lesser relative to the first diameter.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, the developer tool described herein includes a dispenser that includes a greater quantity of nozzles in a central portion relative to a perimeter portion such that the developer tool is capable of more effectively removing material from a photoresist layer near a center of a substrate (which tends to be thicker near the center of the substrate relative to the edge or perimeter of the substrate). In this way, the developer tool may reduce the amount of photoresist residue or scum remaining on the substrate near the center of the substrate after a development operation, which may enable defect removal and/or prevention, may increase semiconductor processing yield, and/or may increase semiconductor processing quality.

As described in greater detail above, some implementations described herein provide a method. The method includes positioning a substrate on a chuck of a developer tool. The method includes rotating the substrate on the chuck. The method includes dispensing a developer agent onto an exposed photoresist layer on the substrate while the substrate is rotating on the chuck, where the developer agent is dispensed through a plurality of nozzles of the developer tool onto a central portion of the substrate, and where the developer agent is dispensed through a respective plurality of openings in each of the plurality of nozzles.

As described in greater detail above, some implementations described herein provide a developer tool. The developer tool includes a dispenser. The developer tool includes a first plurality of nozzles, on the dispenser, each including a respective single opening. The developer tool includes a second plurality of nozzles, on the dispenser, each including a respective plurality of openings.

As described in greater detail above, some implementations described herein provide a method. The method includes rotating a substrate on a chuck of a developer tool. The method includes dispensing, while the substrate is rotating on the chuck, a developer agent through a first subset of a first plurality of nozzles of a first type onto a perimeter portion of the substrate. The method includes dispensing, while the substrate is rotating on the chuck, the developer agent through, a second subset of the first plurality of nozzles of the first type onto a central portion of the substrate, and a second plurality of nozzles of a second type onto the central portion of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    dispensing a developer agent onto an exposed photoresist layer on a substrate while the substrate is being rotated,
        wherein the developer agent is dispensed through a first plurality of nozzles of a first type onto a central portion of the substrate and a second plurality of nozzles of a second type onto a perimeter portion of the substrate,
        wherein a first quantity of openings associated with the first type is greater than a second quantity of openings associated with the second type, and
        wherein the developer agent is dispensed through respective openings in each of the first plurality of nozzles and the second plurality of nozzles.

2. The method of claim 1, further comprising:
    dispensing a photoresist material on the substrate while the substrate is being rotated; and
    performing an exposure operation to form the exposed photoresist layer on the substrate.

3. The method of claim 2, wherein performing the exposure operation comprises:
    exposing the photoresist material on the substrate to radiation to form a pattern.

4. The method of claim 3, further comprising:
    performing a development operation on the exposed photoresist layer to expose the pattern,
    wherein performing the development operation comprises the dispensing of the developer agent onto the exposed photoresist layer.

5. The method of claim 1, wherein an opening associated with the first type is smaller in diameter than an opening associated with the second type.

6. The method of claim 1, wherein dispensing the developer agent comprises:
    dispensing the developer agent through a third plurality of nozzles of the second type onto the central portion of the substrate.

7. The method of claim 1, wherein dispensing the developer agent comprises:
    dispensing the developer agent at different dispensing angles.

8. A developer tool, comprising:
a dispenser;
a first plurality of nozzles on a perimeter portion of the dispenser, the first plurality of nozzles including a first type of nozzle that includes a single opening; and
a second plurality of nozzles on a central portion of the dispenser, the second plurality of nozzles including a second type of nozzle that includes a plurality of openings,
wherein a first quantity of the first plurality of nozzles is less than a second quantity of the second plurality of nozzles.

9. The developer tool of claim 8, wherein an opening associated with the second type is smaller in diameter than an opening associated with the first type.

10. The developer tool of claim 8, further comprising:
a third plurality of nozzles of the first type on the central portion of the dispenser.

11. The developer tool of claim 10, wherein the second plurality of nozzles are arranged in a first row in the central portion of the dispenser and the third plurality of nozzles are arranged in a second row in the central portion of the dispenser.

12. The developer tool of claim 10, wherein the second plurality of nozzles and the third plurality of nozzles are arranged in a single row in the central portion of the dispenser.

13. The developer tool of claim 10, wherein the second quantity of the second plurality of nozzles is greater than a third quantity of the third plurality of nozzles.

14. The developer tool claim 8, wherein the second plurality of nozzles are arranged in a plurality of rows in the central portion of the dispenser.

15. A method, comprising:
rotating a substrate on a chuck;
dispensing, while the substrate is rotating on the chuck, a developer agent through one or more first nozzles of a first type onto a perimeter portion of the substrate;
dispensing, while the substrate is rotating on the chuck, the developer agent through one or more second nozzles of the first type onto a central portion of the substrate; and
dispensing, while the substrate is rotating on the chuck, the developer agent through one or more third nozzles of a second type onto the central portion of the substrate,
wherein a first quantity associated with the one or more first nozzles is fewer than a second quantity associated with the one or more second nozzles and the one or more third nozzles, and
wherein a first quantity of openings associated with the first type is fewer than a second quantity of openings associated with the second type.

16. The method of claim 15, wherein a third quantity associated with the one or more third nozzles is fewer than a fourth quantity of associated with the one or more second nozzles.

17. The method of claim 15, further comprising:
dispensing a photoresist material on the substrate while the substrate is rotating on the chuck; and
performing an exposure operation to form an exposed photoresist layer on the substrate.

18. The method of claim 17, wherein performing the exposure operation comprises:
exposing the photoresist material on the substrate to radiation to form a pattern.

19. The method of claim 18, wherein the pattern is exposed based on dispensing the developer agent through the one or more first nozzles onto the perimeter portion of the substrate and through the one or more second nozzles and the one or more third nozzles onto the central portion of the substrate.

20. The method of claim 15, wherein dispensing the developer agent through the one or more second nozzles onto the central portion of the substrate comprises:
dispensing the developer agent through two or more second nozzles at different dispensing angles.

* * * * *